(12) United States Patent
DiCaprio et al.

(10) Patent No.: US 6,452,278 B1
(45) Date of Patent: Sep. 17, 2002

(54) LOW PROFILE PACKAGE FOR PLURAL SEMICONDUCTOR DIES

(75) Inventors: Vincent DiCaprio, Mesa; Sean T. Crowley, Phoenix; J. Mark Bird, Apache Junction, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 30 days.

(21) Appl. No.: 09/608,197

(22) Filed: Jun. 30, 2000

(51) Int. Cl.$^7$ ............................................. H01L 29/40
(52) U.S. Cl. ..................... 257/777; 257/723; 257/686
(58) Field of Search ................................. 257/777, 723, 257/685, 686, 787

(56) References Cited

U.S. PATENT DOCUMENTS

| | | | |
|---|---|---|---|
| 3,851,221 A | 11/1974 | Beaulieu et al. ............ 317/100 |
| 4,567,643 A | 2/1986 | Droguet et al. ............... 29/575 |
| 4,730,232 A | 3/1988 | Lindberg .................... 361/381 |
| 4,763,188 A | 8/1988 | Johnson ...................... 357/74 |
| 4,982,265 A | 1/1991 | Watanabe et al. ............. 357/75 |
| 4,996,587 A | 2/1991 | Hinrichsmeyer et al. ...... 357/74 |
| 5,012,323 A | 4/1991 | Farnworth ................... 357/75 |
| 5,025,306 A | 6/1991 | Johnson et al. .............. 357/75 |
| 5,040,052 A | 8/1991 | McDavid ..................... 357/80 |
| 5,138,438 A | 8/1992 | Masayuki et al. ............ 357/75 |
| 5,140,404 A | 8/1992 | Fogal et al. .................. 357/70 |
| 5,165,067 A | 11/1992 | Wakefield et al. .......... 257/783 |
| 5,198,888 A | 3/1993 | Sugano et al. .............. 257/686 |
| 5,200,362 A | 4/1993 | Lin et al. .................... 437/207 |
| 5,229,647 A | 7/1993 | Gnadinger .................. 257/785 |
| 5,273,938 A | 12/1993 | Lin et al. .................... 437/207 |
| 5,291,061 A | 3/1994 | Ball .......................... 257/686 |
| 5,323,060 A | 6/1994 | Fogal et al. ................. 257/777 |

(List continued on next page.)

FOREIGN PATENT DOCUMENTS

| | | | |
|---|---|---|---|
| EP | 503 201 A2 | 12/1991 | ......... H01L/23/495 |
| JP | 54-128274 | 4/1979 | ........... H01L/23/30 |
| JP | 56062351 | 5/1981 | ........... H01L/25/04 |
| JP | 60182731 | 9/1985 | ........... H01L/21/60 |
| JP | 61059862 | 3/1986 | ........... H01L/25/04 |
| JP | 61117858 | 6/1986 | ........... H01L/25/08 |
| JP | 62-12661 | 6/1987 | ........... H01L/25/04 |
| JP | 62119952 | 6/1987 | ........... H01L/25/04 |
| JP | 62126661 | 6/1987 | ........... H01L/25/04 |
| JP | 62142341 | 6/1987 | ........... H01L/25/04 |
| JP | 63128736 | 6/1988 | ........... H01L/23/04 |
| JP | 63211663 | 9/1988 | ........... H01L/25/08 |
| JP | 63244654 | 10/1988 | ........... H01L/23/28 |
| JP | 63-244654 | 10/1988 | ........... H01L/23/28 |
| JP | 1028856 | 1/1989 | ........... H01L/27/00 |
| JP | 64001269 | 1/1989 | ........... H01L/25/04 |
| JP | 1071162 A | 3/1989 | ........... H01L/23/52 |
| JP | 1099248 A | 4/1989 | ........... H01L/25/08 |
| JP | 3169062 | 7/1991 | ......... H01L/25/065 |

(List continued on next page.)

*Primary Examiner*—Roy Potter
(74) *Attorney, Agent, or Firm*—Skjerven Morrill LLP; James E. Parsons

(57) ABSTRACT

A package for one or more semiconductor die is disclosed, along with a method of making the package. In one embodiment, the package includes a substrate having opposed top and bottom surfaces and an aperture therebetween. The substrate includes an insulative layer and top and bottom metal layers on the insulative layer around the aperture. The metal layers are electrically connected through the insulative layer. At least one die is supported within the aperture by an insulative encapsulant material. The bottom surface of the die is exposed. In alternative embodiments, a stack including a plurality of die (e.g., two die) are supported in the aperture. Rectangular metal are provided in a single row on the bottom surface of the substrate along at least two edges of the package.

21 Claims, 5 Drawing Sheets

U.S. PATENT DOCUMENTS

| | | | |
|---|---|---|---|
| 5,334,875 A | 8/1994 | Sugano et al. | 257/686 |
| 5,347,429 A | 9/1994 | Kohno et al. | 361/813 |
| 5,422,435 A | 6/1995 | Takiar et al. | 174/52.4 |
| 5,426,563 A | 6/1995 | Moresco et al. | 361/689 |
| 5,432,729 A | 7/1995 | Carson et al. | 365/63 |
| 5,436,203 A | 7/1995 | Lin | 437/209 |
| 5,463,253 A | 10/1995 | Wali et al. | 257/724 |
| 5,473,196 A | 12/1995 | De Givry | 257/786 |
| 5,474,958 A * | 12/1995 | Djennas et al. | 437/211 |
| 5,495,394 A | 2/1996 | Kornfeld et al. | 361/764 |
| 5,495,398 A | 2/1996 | Takiar et al. | 361/790 |
| 5,502,289 A | 3/1996 | Takiar et al. | 174/266 |
| 5,514,907 A | 5/1996 | Moshayedi | 257/723 |
| 5,545,922 A | 8/1996 | Golwalkar et al. | 257/676 |
| 5,569,625 A | 10/1996 | Yoneda et al. | 29/827 |
| 5,581,498 A | 12/1996 | Ludwig et al. | 365/63 |
| 5,587,341 A | 12/1996 | Masayuki et al. | 437/206 |
| 5,604,376 A | 2/1997 | Hamburgen et al. | 257/676 |
| 5,614,766 A | 3/1997 | Takasu et al. | 257/777 |
| 5,620,928 A | 4/1997 | Lee et al. | 438/118 |
| 5,637,536 A | 6/1997 | Val | 438/686 |
| 5,637,912 A | 6/1997 | Cockerill et al. | 257/620 |
| 5,646,828 A | 7/1997 | Degani et al. | 361/715 |
| 5,682,062 A | 10/1997 | Gaul | 257/686 |
| 5,689,135 A | 11/1997 | Ball | 257/676 |
| 5,696,031 A | 12/1997 | Wark | 437/209 |
| 5,715,147 A | 2/1998 | Nagano | 361/813 |
| 5,721,452 A | 2/1998 | Fogal et al. | 257/685 |
| 5,739,581 A | 4/1998 | Chillara et al. | 257/668 |
| 5,783,870 A | 7/1998 | Mostafazadeh et al. | 257/791 |
| 5,793,108 A | 8/1998 | Nakahishi et al. | 257/723 |
| 5,798,014 A | 8/1998 | Weber | 156/263 |
| 5,815,372 A | 9/1998 | Gallas | 361/760 |
| 5,835,355 A | 11/1998 | Dordi | 361/760 |
| 5,861,666 A | 1/1999 | Bellaar | 257/686 |
| 5,866,949 A | 2/1999 | Schueller | 257/778 |
| 5,872,025 A | 2/1999 | Cronin et al. | 438/109 |
| 5,885,849 A | 3/1999 | DiStefano et al. | 438/108 |
| 5,886,412 A | 3/1999 | Fogal et al. | 257/777 |
| 5,894,108 A | 4/1999 | Mostafazadeh et al. | 174/52.4 |
| 5,903,052 A | 5/1999 | Chen et al. | 257/706 |
| 5,917,242 A | 6/1999 | Ball | 257/737 |
| 5,952,611 A | 9/1999 | Eng et al. | 174/52.4 |
| 5,973,403 A | 10/1999 | Wark | 257/777 |
| 5,977,640 A | 11/1999 | Bertin et al. | 257/777 |
| 5,986,317 A | 11/1999 | Wiese | 257/433 |
| 6,001,671 A | 12/1999 | Fjelstad | 438/112 |
| 6,005,778 A | 12/1999 | Spielberger et al. | 361/770 |
| 6,013,948 A | 1/2000 | Akram et al. | 257/698 |
| RE36,613 E | 3/2000 | Ball | 257/777 |
| 6,034,427 A | 3/2000 | Lan et al. | 257/698 |
| 6,051,886 A | 4/2000 | Fogal et al. | 257/777 |
| 6,057,598 A | 5/2000 | Payne et al. | 257/723 |
| 6,060,778 A | 5/2000 | Jeong et al. | 257/710 |
| 6,072,243 A | 6/2000 | Nakanishi | 257/783 |
| 6,080,264 A | 6/2000 | Ball | 156/292 |
| 6,100,804 A | 8/2000 | Brady et al. | 340/572.7 |
| 6,107,689 A | 8/2000 | Kozono | 257/778 |
| 6,118,184 A | 9/2000 | Ishio et al. | 257/787 |
| 6,126,428 A | 10/2000 | Mitchell et al. | 425/110 |
| 6,127,833 A | 10/2000 | Wu et al. | 324/755 |
| 6,133,637 A | 10/2000 | Hikita et al. | 257/777 |
| 6,160,705 A | 12/2000 | Stearns et al. | 361/704 |
| 6,172,419 B1 | 1/2001 | Kinsman | 257/737 |
| 6,184,463 B1 | 2/2001 | Panchou et al. | 174/52.4 |
| 6,198,171 B1 | 3/2001 | Huang et al. | 257/787 |
| 6,214,641 B1 | 4/2001 | Akram | 438/107 |
| 6,235,554 B1 | 5/2001 | Akram et al. | 438/109 |

FOREIGN PATENT DOCUMENTS

| | | | | |
|---|---|---|---|---|
| JP | 4028260 | 1/1992 | | H01L/25/065 |
| JP | 4-56262 | 2/1992 | | H01L/25/65 |
| JP | 4056262 | 2/1992 | | H01L/25/065 |
| JP | 4096358 | 3/1992 | | H01L/25/065 |
| JP | 4116859 | 4/1992 | | H01L/25/065 |
| JP | 4-368154 A | 12/1992 | | H01L/23/00 |
| JP | 4-368167 | 12/1992 | | H01L/25/065 |
| JP | 5013665 | 1/1993 | | H01L/25/065 |
| JP | 5-75015 A | 3/1993 | | H01L/25/065 |
| JP | 5109975 | 4/1993 | | H01L/25/065 |
| JP | 5136323 | 6/1993 | | H01L/23/50 |
| JP | 5-283601 | 10/1993 | | H01L/23/52 |
| JP | 10-256470 | 9/1998 | | H01L/25/065 |

* cited by examiner

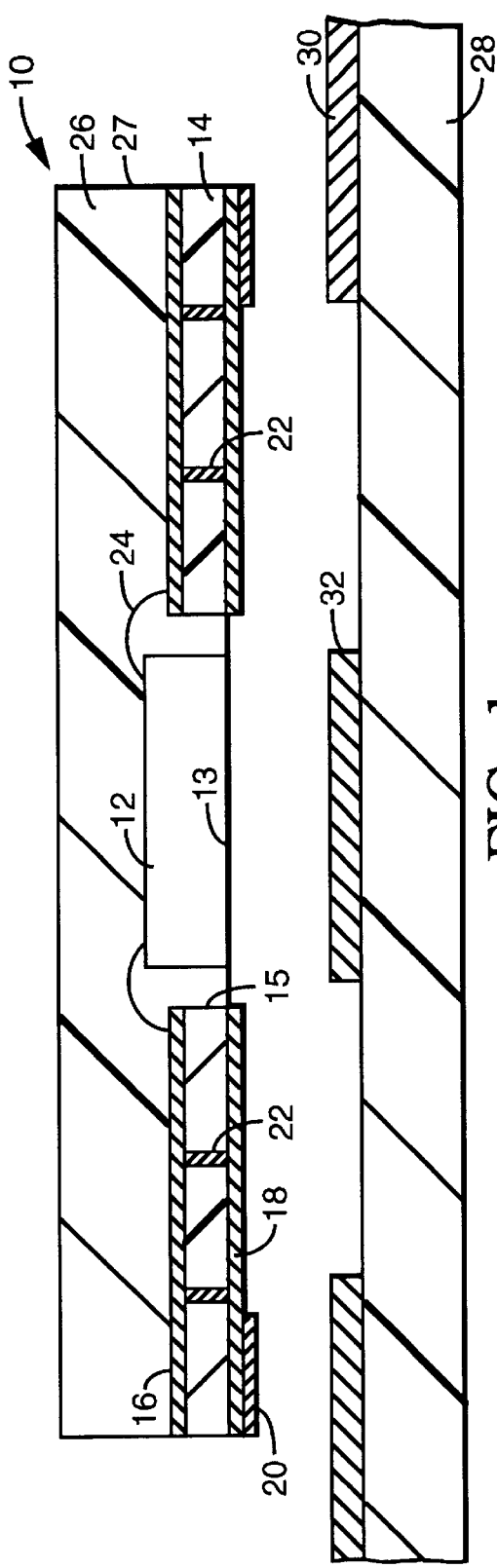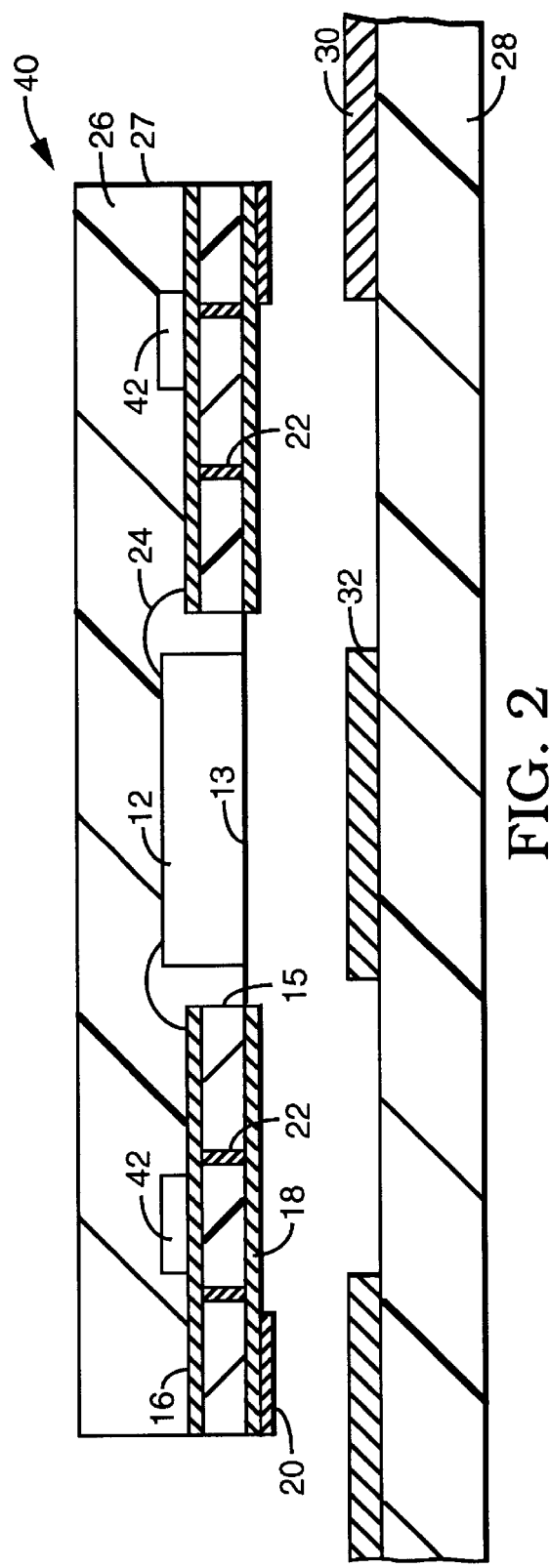

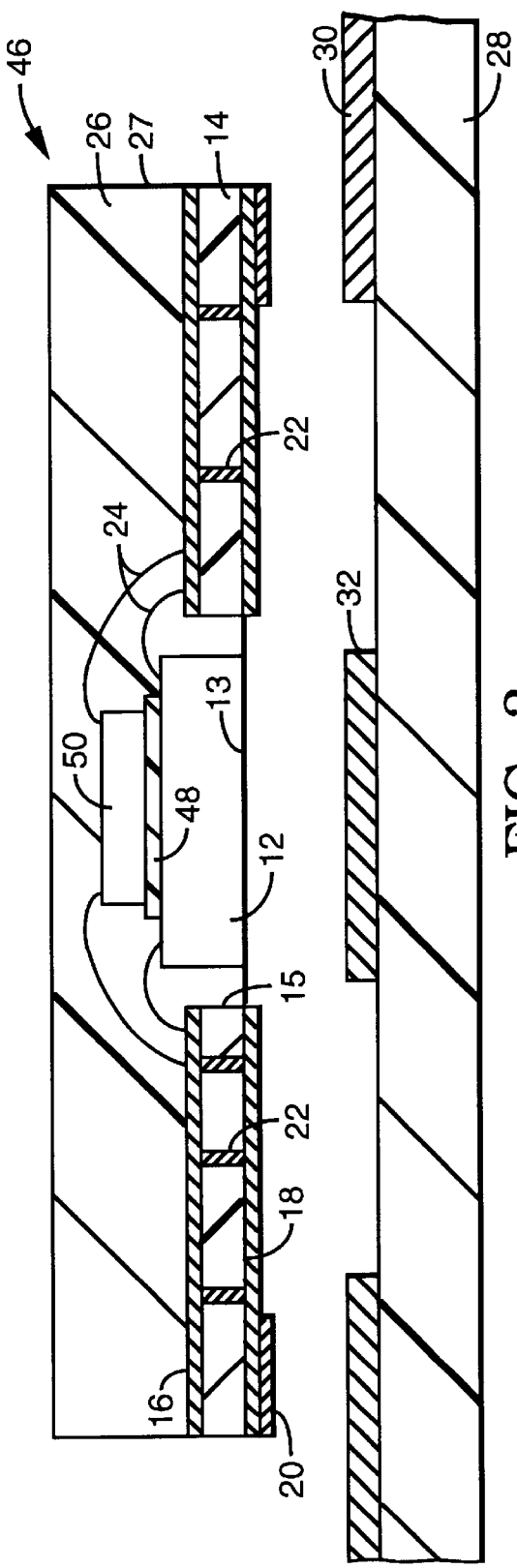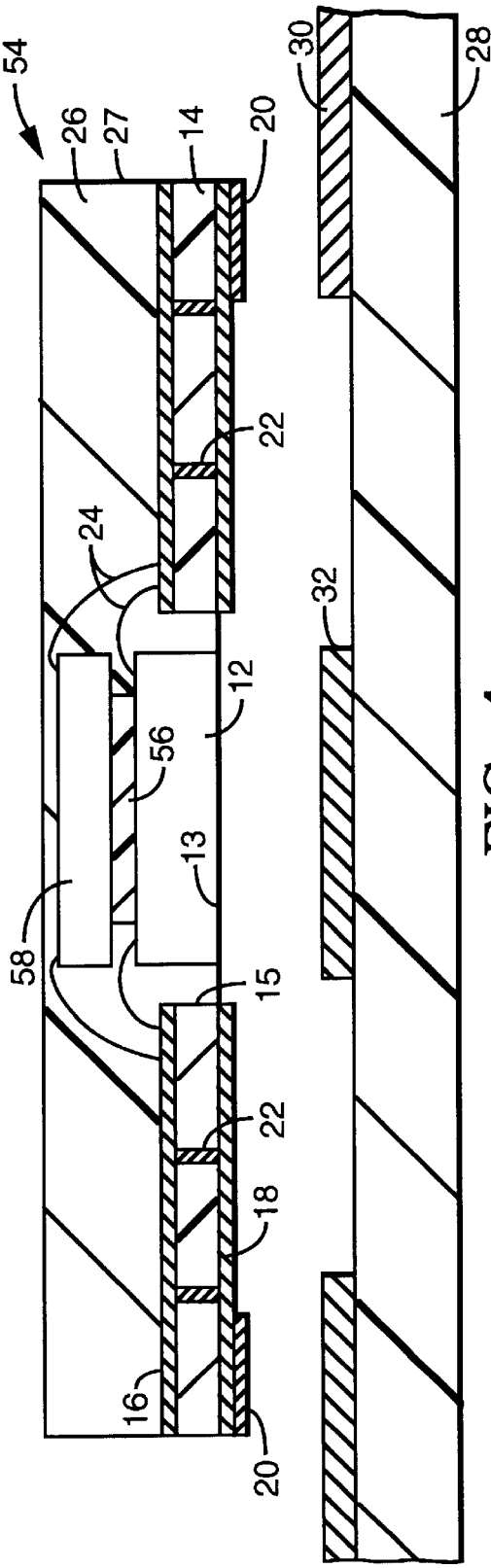

LOW PROFILE PACKAGE FOR PLURAL SEMICONDUCTOR DIES

BACKGROUND OF THE INVENTION

Modern electronic devices, such as portable telephones and pagers, are becoming increasingly complex, while continually shrinking in size. Accordingly, the semiconductor chips (also called "die") that are used within those electronic devices, such as microprocessor chips and memory chips, must be packaged in packages that are highly functional, yet small in size. In addition, the packages must have good heat dissipation capabilities.

SUMMARY OF THE INVENTION

The present invention includes package embodiments that are very thin and have excellent heat dissipation capabilities. Moreover, the packages are highly functional. For example, the packages may accommodate one die or a plurality of stacked die, and also may accommodate passive devices in addition to the die(s).

One embodiment of a package within the present invention includes a substrate having opposed top and bottom surfaces and an aperture therebetween. The substrate includes an insulative layer and at least top and bottom metal layers on the insulative layer around the aperture. The metal layers are electrically connected through the insulative layer. At least one die is supported within the aperture by an insulative encapsulant material. The bottom surface of the die is exposed. In alternative embodiments, a stack of dies (e.g., two die) is supported in the aperture. Rectangular metal input/output contacts, which are electrically connected to the die, are provided in a single row on the bottom surface of the substrate along at least two edges of the package. Alternatively, a checkerboard array of metal input/output contacts may be formed on the bottom surface of the substrate around the aperture.

In alternative embodiments, a pair of die are stacked in the aperture. The lower surface of the lower die is exposed.

These and other features of the present invention will become apparent in light of the following detailed description.

BRIEF DESCRIPTION OF THE DRAWINGS

FIG. 1 is a cross-sectional side view of a package for a semiconductor die.

FIG. 2 is a cross-sectional side view of a package for a semiconductor die, wherein passive components are mounted on the substrate so as to form a module.

FIG. 3 is a cross-sectional side view of a package for a stack of two differently-sized semiconductor dies.

FIG. 4 is a cross-sectional side view of a package for a stack of two same-size semiconductor dies.

In the various drawings, similar features in the various embodiments are usually referred to using the same reference numbers.

DETAILED DESCRIPTION

Figure 5:
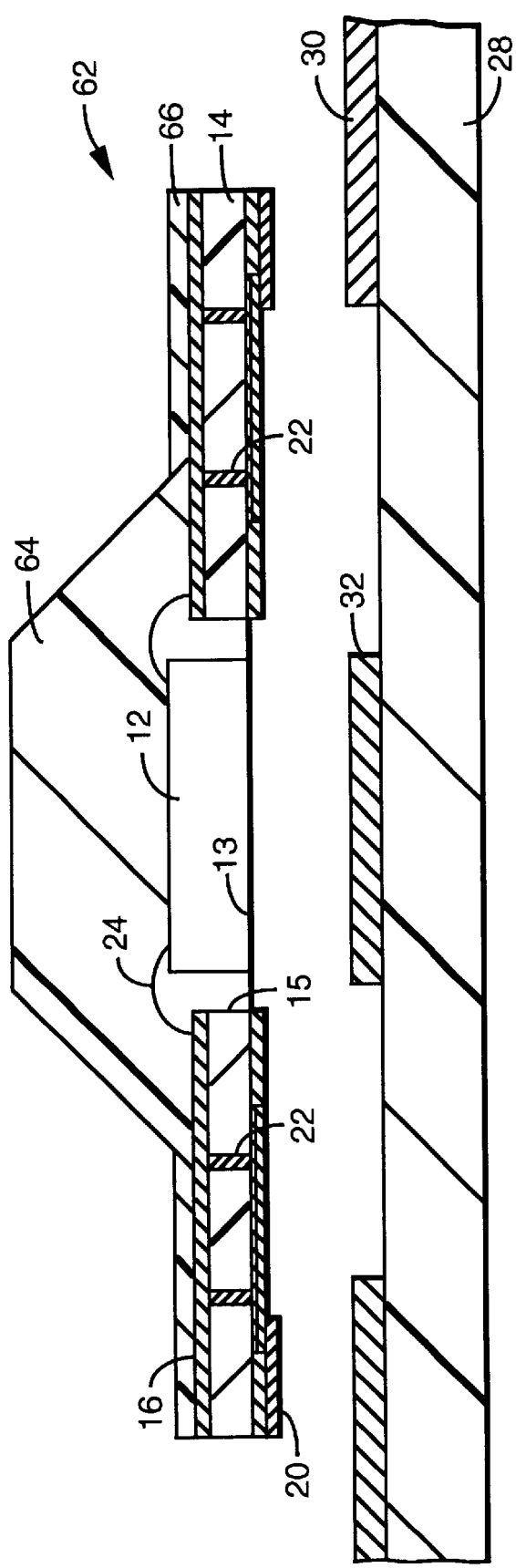
FIG. 5 is a cross-sectional side view of a package for a semiconductor die, where the die is encapsulated in an individually molded encapsulant material.

Aspects of the present invention have similarity to concepts described in the following pending U.S. patent applications Ser. Nos.: 09/566,069; 09/574,541; 09/574,006, 09/589,713; 09/103,760 (now U.S. Pat. No. 6,143,981); and 09/176,614 (now U.S. Pat. No. 6,281,568). All of the above applications are incorporated herein by reference in their respective entireties.

FIG. 1 is cross-sectional side view of an embodiment of a package within the present invention. Package 10 of FIG. 1 houses a semiconductor die 12. Die 12 may be any type of semiconductor die (also called a chip). For example, die 12 may be a microprocessor, a memory, or a high power device (e.g., amplifier). To provide a thinner package, the bottom, exposed surface 13 of die 12 may be polished so as to thin die 12.

Die 12 is partially encapsulated in a hardened insulative encapsulant 26, which may be a molded plastic material or a hardened liquid encapsulant material. In this embodiment, package 10 has orthogonal peripheral sides 27, which may be formed (see FIG. 7) by overmolding a plurality of package sites 81 of a substrate strip 80, and singulating the package sites 81 with a saw to form individual packages 10. Alternatively, encapsulant 26 may be formed using a liquid encapsulant material.

Package 10 includes a substrate 14 having a central rectangular aperture 15 that extends through substrate 14. Die 12 is supported within aperture 14 by the adhesion of encapsulant 26 to die 12. The top, active surface of die 12 and the peripheral sides of die 12 are covered by encapsulant 26. As mentioned above, however, bottom surface 13 of die 12 is not covered by encapsulant 26, but rather is exposed. By supporting die 12 in aperture 15, the height of package 10 is minimized.

Substrate 14 includes upper and lower metal layers 16 and 18, respectively, and an insulative core. The insulative core layer may be formed of a variety of materials, such as a thin tape or a laminate. For example, a thin tape made of polyimide or some other plastic material may be used. Alternatively, the insulative core layer may be formed of BT resin, a glass reinforced epoxy material, or ceramic. In alternative embodiments, substrate 14 may include additional metal layers between top layer 16 and bottom layer 18.

Metal layers 16 and 18 include a plurality of individual metal traces. Metal layers 16 and 18 may be formed of copper or aluminum, which in turn may be plated with metals such as nickel, gold, and silver, among other possibilities.

Die 12 is electrically connected by bond wires 24 to bond fingers of metal layer 16. Wire bonds 24 have a low loop height to help minimize the height of package 10. Metal layers 16 and 18 are electrically connected through substrate 14 by metal vias 22. A plurality of rectangular and planar metal contacts 20 are provided on the bottom surface of substrate 14. Contacts 20 are the input/output terminals of package 10. Contacts 20 are electrically connected to metal layer 18. In view of the above described electrical connections, die 12 is electrically connected to contacts 20 for external connection.

Contacts 20 each have a first end that begins at the peripheral side 27 of package 10, and extend inward to an opposite second end that is a short distance closer to die 12. Contacts 20 may be copper plated with gold, silver, or other metals. Contacts 20 may be in a single row along two sides 27 of package 10, as in a dual package, or along each of the four sides 27 of package 10, as in quad package. In an alternative embodiment, instead of having contacts 20 along the edges of the bottom surface of substrate 14, a checkerboard array of metal contacts may be formed on the bottom surface of substrate 14 around aperture 15, as in a land grid array package.

Package 10 may be mounted on a printed circuit board 28. Contacts 20 may be SMT soldered to metal traces 30 of printed circuit board 10. In the embodiment of FIG. 1, the exposed lower surface 13 of die 12 will be thermally and/or electrically connected by a die attach material 32 to a heat sink or voltage supply (e.g., ground) contact of printed circuit board 28. For example, die attach material 32 may be a solder paste, thermal adhesive, thermal grease, or thermal tape. In an alternative embodiment, die attach material 32 may be omitted, so that the exposed lower surface 13 of die 12 is spaced above printed circuit board 28. In such an embodiment, die 12 is air cooled.

FIG. 2 provides an alternative embodiment of a package within the present invention. Package 40 of FIG. 2 is similar to package 10 of FIG. 1, except that passive devices 42 are mounted on the upper surface of substrate 14 of package 40. Passive devices 42 are electrically connected to metal layer 16, and are thereby electrically connected to die 12. Accordingly, package 40 functions as a module. In such an embodiment, passive devices 42 may be, for example, resistors, capacitors, or inductors, and die 12 may be a power device.

FIG. 3 provides a further alternative embodiment of a package within the present invention. Package 46 of FIG. 3 is similar to package 10 of FIG. 1, except that package 46 includes a smaller, second die 50 that is stacked on die 12. Die 50 is attached to the active surface of die 12 by an adhesive layer 48, which may be, for example, an adhesive film, a double sided tape, or a layer of epoxy. Die 50 and adhesive layer 48 are entirely within a perimeter defined by the edge bond pads of die 12, which leaves room for the connection of low loop bond wires 24 to die 12.

FIG. 4 provides a further embodiment of a package within the present invention. Package 54 of FIG. 4 is similar to package 46 of FIG. 3, except that upper die 58 is the same size as lower die 58. Further, adhesive layer 48 of FIG. 3 is replaced by a thicker insulative spacer 56, which has sufficient height to space die 58 high enough above die 12 to allow the connection of low loop bond wires 24 to lower die 12. Spacer 58 may be a double sided adhesive tape, an adhesive film, or a core of an insulative material coated on both sides with an adhesive.

In FIGS. 3 and 4, each of the stacked dies may be thinned by polishing to minimize the thickness of the package.

FIG. 5 provides a further alternative embodiment of a package within the present invention. Package 62 of FIG. 5 is similar to package 10 of FIG. 1, except that encapsulant 64 is individually molded over die 12, bond wires 24, the inner bond fingers of metal layer 16, and an inner portion of the top surface of substrate 14 around aperture 15. The sides of encapsulant 64 are tapered. A thin layer of an insulative material 66 (e.g., epoxy solder mask) covers the remainder of metal layer 16.

FIGS. 6(a) through 6(i) provide views of stages in an exemplary method of assembling package 62 of FIG. 5. In this exemplary method, a plurality of packages 62 are assembled in parallel using a rectangular substrate strip 80, as shown in FIG. 7.

Figure 7:
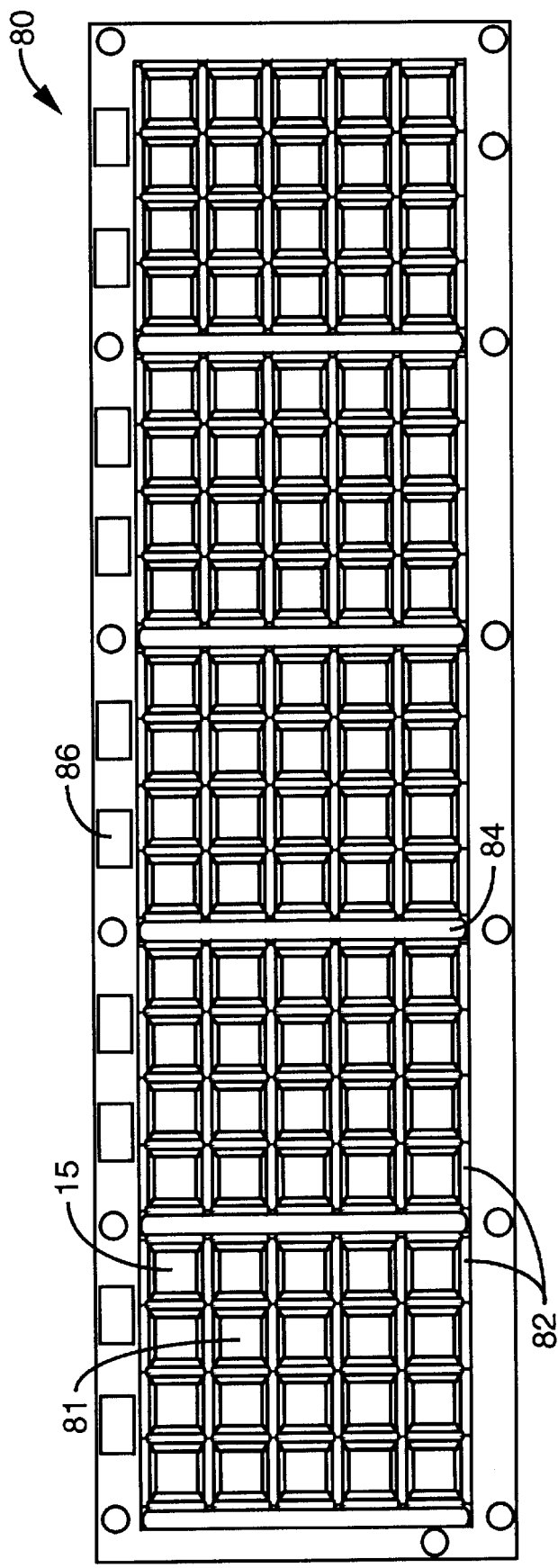
FIG. 7 is a top plan view of a substrate strip that may be used in the method of FIG. 6

Substrate strip 80 of FIG. 7 includes a rows and columns of package sites 81, which are grouped into five substrips 82. Each package site 81 includes the above described elements of substrate 14 of FIGS. 1–5. Towards the end of the exemplary method, package sites 81 of substrate strip 80 are singulated so as to form individual packages. Substrips 82 are separated by rectangular slits 84. Additional slits (not shown) may be formed around the perimeter of each package site 81. Metal ground planes 86 on the upper and lower surfaces of substrate strip 80 facilitate discharge of any static electricity that may collect on substrate strip 80 during the assembly process. The metal layers 16, 18 of each package site of the substrate strip 80 or the respective substrips 82 may be electrically interconnected until singulation to further facilitate electrostatic discharge protection.

Figure 6A:
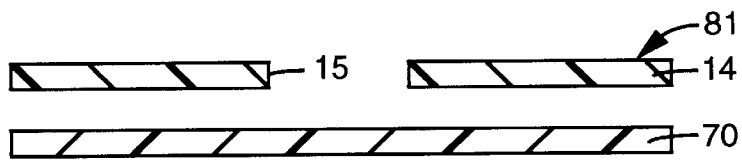
FIGS. 6(a)–6(i) are cross-sectional views of stages in an exemplary assembly method for the package of FIG. 5.
Figure 6B:
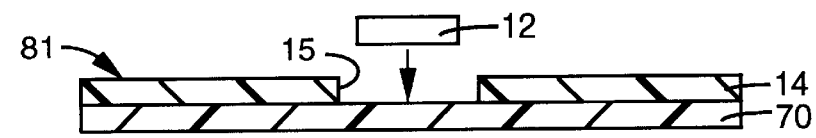
Figure 6C:
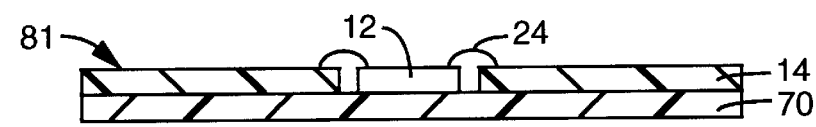
Figure 6D:
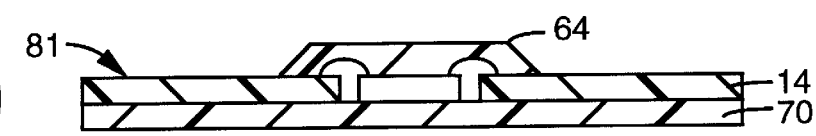
Figure 6E:
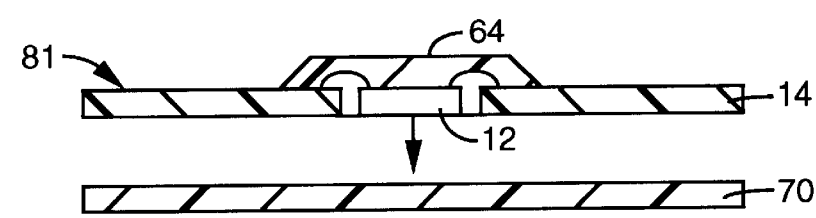
Figure 6F:
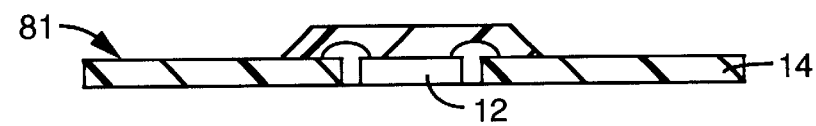
Figure 6G:
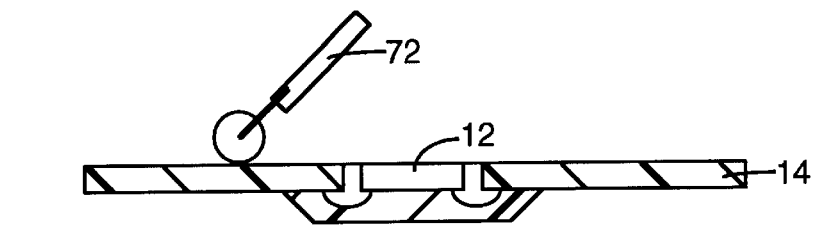
Figure 6H:
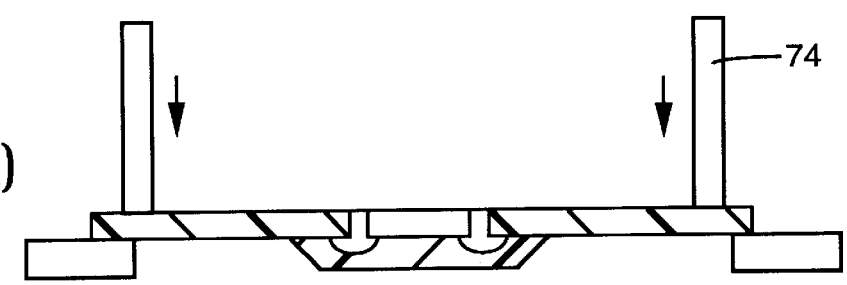
Figure 6I:

FIGS. 6(a) through 6(i) illustrate the assembly of a package 62 with reference to one package site 81 of substrate strip 80. Readers will appreciate, however, that the method is performed at each package site 81 of substrate strip 80. Referring to FIG. 6(a) a temporary tape 70 is adhesively attached to the lower surface of the substrate 14 of each package site 81, so that aperture 15 is covered. A unitary tape 70 may be applied over the apertures 15 of each substrip 82 or of all of the substrips 82 of substrate strip 80 (FIG. 7). A die 12 is then mounted on temporary tape 70 within each aperture 15 (FIG. 6(b)). Die 12 is wire bonded to the metal layer 16 of the substrate 14 of the package site 81 (FIG. 5 and FIG. 6(c)). Encapsulant 64 is then molded over each die 12 (FIG. 6(d)). Tape 70 is then removed from substrate 14, thereby exposing lower surface 13 of the die 12 of each package site (FIG. 6(e)). Tape 70 may be a tape whose adhesive properties may be negated by application of ultra violet light. Tape 70 may be removed by punching through slots 84 (FIG. 7) with a punch, and then peeling tape 70 off substrate strip 80. Optionally, the lower surface 13 of each die 12 may be marked or coated using a marking/coating device 72 (FIG. 6(g)). The various packages 81 are then singulated using, for example, a punch 74 (FIG. 6(h)). Alternatively, a saw may be used. The result of the method is a plurality of packages 62 (FIG. 5 and FIG. 6(i)).

The packages of FIGS. 1–4 may be made by variations of the method of FIGS. 6(a)–6(i). In those figures, the package sites 81 of each substrip 82 may be encapsulated in a single block, which may then be cut with a saw to form individual packages. The stacked embodiments of FIGS. 3 and 4 require additional die attach and wire bonding steps for the second die. The passive devices 42 of FIG. 2 may be mounted before the encapsulation step.

The various exemplary embodiments described above are illustrative only, and are not intended to limit the scope of the invention to the particular embodiment described.

We claim:

1. A package for plural semiconductor dies, the package comprising:

a substrate having opposed top and bottom surfaces and an aperture therebetween, wherein the substrate includes an insulative layer and top and bottom metal layers on the insulative layer around the aperture, the metal layers being electrically connected through the insulative layer;

at least two die supported in the aperture of the substrate by an encapsulant material and electrically connected to the top metal layer, a bottom surface of at least one of the die being exposed; and metal contacts on the bottom surface of the substrate, wherein said metal contacts are electrically connected to the bottom metal layer, thereby being in an electrical connection with the at least two die.

2. The package of claim 1, wherein at least one passive device is mounted on the top surface of the substrate and is electrically connected to at least one of the dies.

3. A package for one or more semiconductor dies, the package comprising:
- a substrate having opposed top and bottom surfaces and an aperture therebetween, wherein the substrate includes an insulative layer and top and bottom metal layers on the insulative layer around the aperture, the metal layers being electrically connected through the insulative layer;
- at least one die supported within the aperture by an encapsulant material, said encapsulant material covering top and side surfaces of the die, a bottom surface of the die being exposed, wherein at least one passive device is mounted on the top surface of the substrate and is electrically connected to the at least one die;
- electrical conductors electrically connecting the die to the top metal layer; and
- metal contacts on the bottom surface of the substrate, wherein said metal contacts are electrically connected to the bottom metal layer, thereby being in an electrical connection with the at least one die.

4. The package of claim 1, wherein the substrate includes a third metal layer vertically between and electrically connected to the top and bottom metal layers.

5. A package for plural semiconductor dies, the package comprising:
- a substrate having opposed top and bottom surfaces and an aperture therebetween, wherein the substrate includes an insulative layer and top and bottom metal layers on the insulative layer around the aperture, the metal layers being electrically connected through the insulative layer;
- two same size die supported in said aperture by an encapsulant material, wherein a bottom surface of at least one of the die is exposed through said encapsulant material, said dies are stacked one on top of the other with an adhesive layer between the dies, and said dies are electrically connected by bond wires to the top metal layer of the substrate; and
- metal contacts on the bottom surface of the substrate, wherein said metal contacts are electrically connected to the bottom metal layer, thereby being in an electrical connection with the two same size die.

6. A package for plural semiconductor dies, the package comprising:
- an insulative substrate having opposed top and bottom surfaces, an aperture therebetween, and electrically conductive circuit patterns;
- at least two semiconductor dies covered and supported in the aperture by an encapsulant material and electrically connected to some of the circuit patterns, wherein the at least two semiconductor dies are stacked, and a surface of at least one of the dies is uncovered by the encapsulant material; and
- input/output terminals on the bottom surface of the substrate and electrically connected to the at least two semiconductor dies by some of the circuit patterns.

7. The semiconductor package of claim 6, wherein the input/output terminals comprise rectangular metal contacts on the bottom surface of the substrate, said contacts being arrayed in at least one row along two parallel edges of the substrate.

8. The semiconductor package of claim 7, wherein the encapsulant material covers at least part of the top surface of the substrate, and does not cover the bottom surface of the substrate.

9. The semiconductor package of claim 6, wherein the input/output terminals comprise rectangular metal contacts on the bottom surface of the substrate, said contacts being arrayed in a grid array.

10. The semiconductor package of claim 9, wherein the encapsulant material covers at least part of the top surface of the substrate, and does not cover the bottom surface of the substrate.

11. The semiconductor package of claim 6, wherein at least one passive device is mounted on the top surface of the substrate and is electrically connected to at least one of the dies through some of the circuit patterns.

12. The semiconductor package of claim 6, wherein said circuit patterns comprise first circuit patterns on the top surface of the substrate, second circuit patterns on the bottom surface of the substrate, and electrically conductive vias through the substrate each electrically connecting respective ones of the first and second circuit patterns.

13. The semiconductor package of claim 12, wherein the two semiconductor dies are electrically connected to the first circuit patterns by bond wires.

14. A package for plural semiconductor dies, the package comprising:
- an insulative substrate having opposed top and bottom surfaces, an aperture therebetween, and electrically conductive circuit patterns;
- at least two semiconductor die covered and supported in the aperture by an encapsulant material and electrically connected to some of the circuit patterns, wherein a surface of at least one of the dies is uncovered by the encapsulant material; and
- input/output terminals on the bottom surface of the substrate and electrically connected to the at least two semiconductor dies by some of the circuit patterns.

15. The semiconductor package of claim 14, wherein the input/output terminals comprise rectangular metal contacts, said contacts being arrayed in at least one row along two parallel edges of the bottom surface of substrate.

16. The semiconductor package of claim 14, wherein the input/output terminals comprise rectangular metal contacts, said contacts being arrayed in a grid array on the bottom surface of the substrate.

17. The semiconductor package of claim 14, wherein at least one passive device is mounted the substrate and is electrically connected to at least one of the dies through some of the circuit patterns.

18. The semiconductor package of claim 14, wherein the semiconductor dies are stacked.

19. The semiconductor package of claim 18, wherein the two semiconductor dies are the same size.

20. The semiconductor package of claim 14, wherein the encapsulant material covers at least part of the top surface of the substrate, and does not cover the bottom surface of the substrate.

21. A semiconductor package comprising:
- an insulative substrate having opposed top and bottom surfaces, an aperture therebetween, and electrically conductive circuit patterns;
- a semiconductor die covered and supported in the aperture by an encapsulant material and electrically connected to some of the circuit patterns, wherein a surface of the die is uncovered by the encapsulant material;
- at least one passive device mounted on the top surface of the substrate and electrically connected to the die through the circuit patterns; and
- input/output terminals on the bottom surface of the substrate and electrically connected to the at the die by some of the circuit patterns.

* * * * *